(12) United States Patent
Sato et al.

(10) Patent No.: US 7,671,360 B2
(45) Date of Patent: Mar. 2, 2010

(54) SEMICONDUCTOR DEVICE AND METHOD OF PRODUCING THE SAME

(75) Inventors: Natsuki Sato, Tokyo (JP); Tsutomu Hayakawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 161 days.

(21) Appl. No.: 11/849,522

(22) Filed: Sep. 4, 2007

(65) Prior Publication Data

US 2008/0061282 A1 Mar. 13, 2008

(30) Foreign Application Priority Data

Sep. 12, 2006 (JP) ............................. 2006-246692

(51) Int. Cl.
*H01L 29/08* (2006.01)
(52) U.S. Cl. .................. 257/42; 257/E21.068; 438/95; 438/102
(58) Field of Classification Search ............... 438/95, 438/102; 257/42, E21.068
See application file for complete search history.

(56) References Cited

U.S. PATENT DOCUMENTS

| 2006/0175597 | A1 | 8/2006 | Happ | |
| 2007/0023857 | A1* | 2/2007 | Jin et al. | 257/510 |
| 2007/0051936 | A1* | 3/2007 | Pellizzer et al. | 257/4 |
| 2008/0029752 | A1* | 2/2008 | Karpov et al. | 257/2 |

FOREIGN PATENT DOCUMENTS

| JP | 2004-158852 A | 6/2004 |
| JP | 2004-349709 A | 12/2004 |
| JP | 2005-340837 A | 12/2005 |
| JP | 2006-19688 A | 1/2006 |
| JP | 2006/510218 A | 3/2006 |
| JP | 2006-511973 A | 4/2006 |
| JP | 2006-165560 A | 6/2006 |
| JP | 2007-157776 A | 6/2007 |
| JP | 2008-530790 A | 8/2008 |
| WO | WO 03/085740 A1 | 10/2003 |
| WO | 2006/027887 A1 | 3/2006 |
| WO | 2006/084856 A1 | 8/2006 |

* cited by examiner

*Primary Examiner*—Trung Dang
(74) *Attorney, Agent, or Firm*—Sughrue Mion, PLLC (57) ABSTRACT

A phase change memory includes a sidewall insulation film and a heater electrode which are formed in a contact hole formed in an interlayer insulation film on a lower electrode. The heater electrode has a recessed structure. In a recessed area surrounded by the sidewall insulation film, the heater electrode and a phase change film are contacted with each other. A phase change region is formed only in an area contacted with the sidewall insulation film. The sidewall insulation film is an anti-oxidizing insulation film. The phase change region and the heater electrode which are heated to a high temperature upon rewriting are not contacted with the interlayer insulation film as an oxidizing insulation film.

14 Claims, 9 Drawing Sheets

SEMICONDUCTOR DEVICE AND METHOD OF PRODUCING THE SAME

This application is based upon and claims the benefit of priority from Japanese patent application No. 2006-246692, filed Sep. 12, 2006, the disclosure of which is incorporated herein in its entirety by reference.

BACKGROUND OF THE INVENTION

This invention relates to a semiconductor device and a method of producing the same and, in particular, to a semiconductor device having a nonvolatile memory using a phase change material and a method of producing the same.

A semiconductor memory for use in a semiconductor device is categorized into a volatile memory which loses memory information when power supply is turned off and a nonvolatile memory which retains memory information even when power supply is turned off. For example, the volatile memory is a DRAM (Dynamic Random Access Memory) or a SRAM (Static Random Access Memory) while the nonvolatile memory is an EEPROM (Electrically Erasable Programmable Read Only Memory) or a flash memory. In a recent mobile data terminal, for the purpose of miniaturization and power saving, use is often made of the flash memory which retains memory information even when power supply is turned off.

Recently, however, in order to achieve further miniaturization and power saving, attention is focused upon a phase change memory using a phase change material. The phase change memory is a nonvolatile memory in which two different crystal states, i.e., an amorphous state and a crystalline state, of the phase change material are used as memory information. Specifically, the phase change material is switched between the amorphous state having a high resistance value and the crystalline state having a low resistance value to represent memory information of "1" or "0". As the above-mentioned phase change material, a chalcogenide material is used.

In the phase change memory, a rewriting operation is carried out in the following manner. The phase change material is supplied with a sufficient amount of Joule heat to be melted. Thereafter, the phase change material is rapidly cooled to be turned into an amorphous state having a high resistance. Alternatively, the phase change material is supplied with a smaller amount of Joule heat and then slowly cooled to be turned into a crystalline state having a low resistance. The amount of heat to be supplied and a cooling rate are controlled by an electric current value and a length (application time) of a pulse applied to the phase change material. Thus, the rewriting operation as the memory is carried out by switching the phase change material between the different crystal states to change a resistance value. A reading operation of the phase change memory is carried out by utilizing the fact that the value of a flowing electric current is different depending on the amorphous state or the crystalline state of the phase change material.

Figure 1:
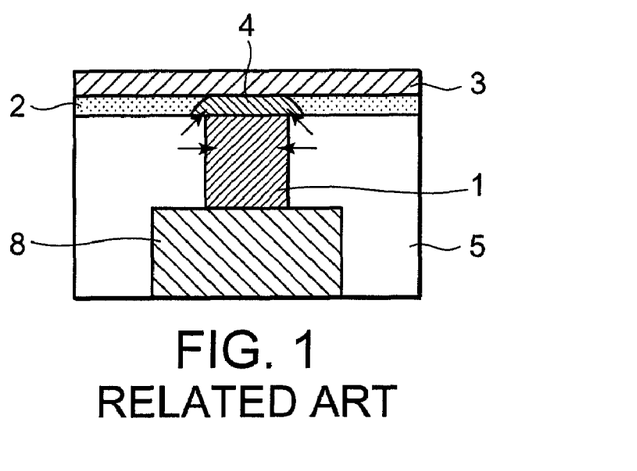
FIG. 1 is a sectional view of a related memory element.

FIG. 1 shows a memory element structure of a related phase change memory. After a lower electrode 8 is formed, an interlayer insulation film 5 is deposited. Then, a contact hole is formed in the interlayer insulation film 5 and a heater electrode 1 is formed in the contact hole. On upper surfaces of the heater electrode 1 and the interlayer insulation film 5, a phase change film 2 and an upper electrode 3 are successively formed. The interlayer insulation film 5, for example, comprising an oxide film ($SiO_2$) surrounds a side surface of the heater electrode 1 and forms a lower layer of the phase change film 2.

When an electric voltage is applied between the upper electrode 3 and the lower electrode 8, Joule heat is produced to switch a crystal state of the phase change film 2 above the heater electrode 1. By switching the crystal state of the phase change film 2, an electric resistance of the phase change film 2 is changed. An area of the phase change film 2 where the crystal state is switched is represented as a phase change region 4. In order to switch the crystal state of the phase change film 2, a temperature not lower than about 600° C. is required. However, by a limited amount of electric current, only a limited area of the phase change film 2 can be heated to a high temperature not lower than 600° C. Therefore, as illustrated in the figure, the phase change region 4 of the phase change film 2 is an area around a contact surface between the heater electrode 1 and the phase change film 2. However, because the interlayer insulation film 5 includes oxygen, the phase change film 2 in the phase change region 4 and the heater electrode 1 are oxidized at such a high temperature not lower than 600° C. so that the phase change memory is varied and degraded in rewriting characteristics.

The phase change memory is described in the following patent documents. Japanese Unexamined Patent Application Publication (JP-A) No. 2005-340837 (Patent Document 1) discloses a semiconductor device comprising a molding film having a protruding portion, a phase change film and an upper electrode formed on the protruding portion of the molding film, and a lower electrode connected to the phase change film. The phase change film and the upper electrode are covered with oxygen barrier films on upper and lateral sides thereof. The molding film comprises an insulation film having a high thermal conductivity and serving as an oxygen barrier, for example, a silicon oxynitride film or a silicon nitride film. Thus, the phase change film is covered with the oxygen barrier films so as to avoid penetration of oxygen and oxidization of the phase change film.

Japanese Unexamined Patent Application Publication (JP-A) No. 2006-19688 (Patent Document 2) discloses a phase change memory comprising a lower electrode, an oxide film formed on the lower electrode and provided with a contact hole, and a spacer, a phase change film, and an oxide film which are formed in the contact hole. With the above-mentioned structure, a contact area between the lower electrode and the phase change film is reduced so that the amount of a rewriting current is reduced. International Patent Publication WO 2003/85740 A1 (Patent Document 3) discloses a nonvolatile memory comprising an organic dielectric film provided with a hole penetrating therethrough. On one side of the organic dielectric film, an inorganic dielectric film, a recording layer, and an upper electrode are formed. In the hole, a heater electrode is formed. On the other side of the organic dielectric film, a lower electrode is formed. A part of the organic dielectric film which would be heated to a high temperature in the vicinity of the recording layer is covered with the inorganic dielectric film so that the organic dielectric film is prevented from being deteriorated due to exposure to a high temperature.

As described above, upon rewriting the phase change memory, it is necessary to supply the heater electrode with an electric current to produce heat so that the phase change region is heated to a temperature not lower than 600° C. If the insulation film around the heater electrode or the phase change film is an oxidizing insulation film, for example, if the interlayer insulation film 5 is a silicon oxide film ($SiO_2$), a heater electrode material or the phase change film is oxidized.

If the heater electrode material is tungsten (W) or titanium nitride (TiN), the heater electrode material is oxidized into WOx or TiON. Consequently, a resistance value of the heater electrode is changed to cause variation or degradation of the rewriting characteristics of the phase change memory. In the following description, a film allowing permeation of oxygen, such as a silicon oxide film, or a film causing diffusion supply of oxygen is called an oxidizing insulation film. On the contrary, a film inhibiting permeation of oxygen or a film causing no diffusion supply of oxygen is called an anti-oxidizing insulation film.

In order to avoid the above-mentioned problem, Patent Document 1 discloses to cover the heater electrode or the phase change film with the anti-oxidizing insulation film. However, in Patent Document 1, the molding film as the interlayer insulation film is formed by a silicon oxynitride film or a silicon nitride film. Thereafter, on the side surface of the phase change film, a side wall comprising a silicon nitride film is formed. Further, these films are entirely covered with a silicon nitride film, a stress relaxation film, and a silicon nitride film. Thus, the heater electrode and the phase change film are entirely surrounded by the silicon nitride film so as to prevent the heater electrode and the phase change film from being oxidized.

However, when the heater electrode and the phase change film are entirely covered with the silicon nitride film, new problems will arise. For example, if the silicon nitride film is thick, a crack is caused in the insulation film due to a film stress. In order to relax the stress, the stress relaxation film is required. This results in an increase in number of steps. Further, since the silicon nitride film has a relative dielectric constant higher than that of the silicon oxide film, a wiring capacitance or line-to-line capacitance is increased. This results in degradation in circuit characteristics such as an increase in power consumption or decrease in operation frequency.

SUMMARY OF THE INVENTION

In view of the above-mentioned problems, it is an object of this invention to provide a semiconductor device having a phase change memory which is prevented from oxidization of a heater electrode or a phase change film and is therefore stably operable.

It is another object of this invention to provide a method of producing a semiconductor device which is easily mass-produced even with a fine pattern and which has a phase change memory stably operable.

In order to achieve the above-mentioned objects, the present application basically adopts the following techniques. It will readily be understood that the present application also encompasses applied techniques as various modifications without departing from the technical scope of this invention.

Semiconductor devices according to this invention and methods according to this invention are as follows:

(1) A semiconductor device comprising a lower electrode formed on a semiconductor substrate, an interlayer insulation film formed on the semiconductor substrate to cover the lower electrode, a sidewall insulation film formed on a sidewall of a contact hole formed in the interlayer insulation film to expose the lower electrode, a heater electrode formed in the contact hole and located inside the sidewall insulation film, a phase change film formed in contact with upper surfaces of the interlayer insulation film, the sidewall insulation film, and the heater electrode, and an upper electrode formed on an upper surface of the phase change film, the sidewall insulation film comprising an anti-oxidization insulation film.

(2) The semiconductor device as described in the above-mentioned (1), wherein the phase change film has a phase change region which is formed on the upper surfaces of the heater electrode and the sidewall insulation film and which is not formed on the upper surface of the interlayer insulation film.

(3) The semiconductor device as described in the above-mentioned (1), wherein the upper surfaces of the sidewall insulation film and the interlayer insulation film are planarized to be located at a same level, the upper surface of the heater electrode being lower in level than those of the interlayer insulation film and the sidewall insulation film.

(4) The semiconductor device as described in the above-mentioned (3), wherein the phase change film has a phase change region which is formed on the upper surfaces of the heater electrode and the sidewall insulation film and which is not formed on the upper surface of the interlayer insulation film.

(5) The semiconductor device as described in the above-mentioned (3), wherein the sidewall insulation film has a thickness not smaller than 5 nm and not greater than 100 nm, the semiconductor device being designed to satisfy:

$$50 \text{ nm} \leq D+T \leq 200 \text{ nm},$$

where D represents a difference in level between the upper surface of the heater electrode and the upper surfaces of the interlayer insulation film and the sidewall insulation film and T represents the thickness of the sidewall insulation film.

(6) The semiconductor device as described in the above-mentioned (5), wherein the phase change film contains at least two elements selected from germanium (Ge), antimony (Sb), tellurium (Te), selenium (Se), gallium (Ga), and indium (In).

(7) The semiconductor device as described in the above-mentioned (5), wherein the sidewall insulation film comprises a nitride film.

(8) The semiconductor device as described in the above-mentioned (5), further comprising a buried insulation film formed in the contact hole and located inside the heater electrode.

(9) The semiconductor device as described in the above-mentioned (1), wherein the interlayer insulation film is a multilayer insulation film comprising an oxidizing insulation film and an anti-oxidizing insulation film.

(10) A method of producing a semiconductor device, comprising the steps of depositing an interlayer insulation film to cover a lower electrode formed on a semiconductor substrate, forming a contact hole in the interlayer insulation film to expose the lower electrode, forming an anti-oxidizing sidewall insulation film on a sidewall of the contact hole, forming a heater electrode in the contact hole and inside the sidewall insulation film, planarizing upper surfaces of the sidewall insulation film, the heater electrode, and the interlayer insulation film so that the upper surfaces of the sidewall insulation film and the heater electrode formed inside the contact hole are located at a same level as that of the interlayer insulation film, etching the heater electrode so that the upper surface of the heater electrode is lower in level than those of the interlayer insulation film and the sidewall insulation film, forming a phase change film in contact with the upper surfaces of the interlayer insulation film, the sidewall insulation film, and the heater electrode, and forming an upper electrode on an upper surface of the phase change film.

(11) The method as described in the above-mentioned (10), wherein the sidewall insulation film has a thickness not smaller than 5 nm and not greater than 100 nm, the semiconductor device being designed to satisfy:

$$50\text{ nm} \leq D+T \leq 200\text{ nm},$$

where D represents a difference in level between the upper surface of the heater electrode and the upper surfaces of the interlayer insulation film and the sidewall insulation film and T represents the thickness of the sidewall insulation film.

(12) The method as described in the above-mentioned (10), wherein the step of forming the heater electrode is followed by the step of forming an anti-oxidizing buried insulation film in the contact hole and inside the heater electrode.

(13) The method as described in the above-mentioned (10), wherein the phase change film contains at least two elements selected from germanium (Ge), antimony (Sb), tellurium (Te), selenium (Se), gallium (Ga), and indium (In).

(14) The method as described in the above-mentioned (10), wherein the sidewall insulation film comprises a nitride film.

(15) The method as described in the above-mentioned (10), wherein the interlayer insulation film is formed as a multilayer insulation film comprising an oxidizing insulation film and an anti-oxidizing insulation film.

The phase change memory in the semiconductor device according to this invention comprises the sidewall insulation film and the heater electrode which are deposited in the contact hole formed in the interlayer insulation film on the lower electrode. The phase change memory has the recessed structure in which the upper surface of the heater electrode is lowered as compared with those of the interlayer insulation film and the sidewall insulation film to form a recess. The heater electrode and the phase change film are contacted with each other inside the recess. Therefore, the phase change region is formed in an area adjacent to the sidewall insulation film. Further, the sidewall insulation film comprises an anti-oxidizing insulation film. Therefore, the phase change region and the heater electrode which have a high temperature upon rewriting are not contacted with the oxidizing insulation film but are contacted with the anti-oxidizing insulation film. It is therefore possible to prevent the phase change region and the heater electrode from being oxidized. Since the heater electrode and the phase change region are prevented from being oxidized, it is possible to provide the semiconductor device which is free from variation in rewriting characteristics and is stably operable.

DESCRIPTION OF THE PREFERRED EMBODIMENTS

Now, a semiconductor device and a method of producing the same according to this invention will be described with reference to the drawing.

First Embodiment

Figure 5:
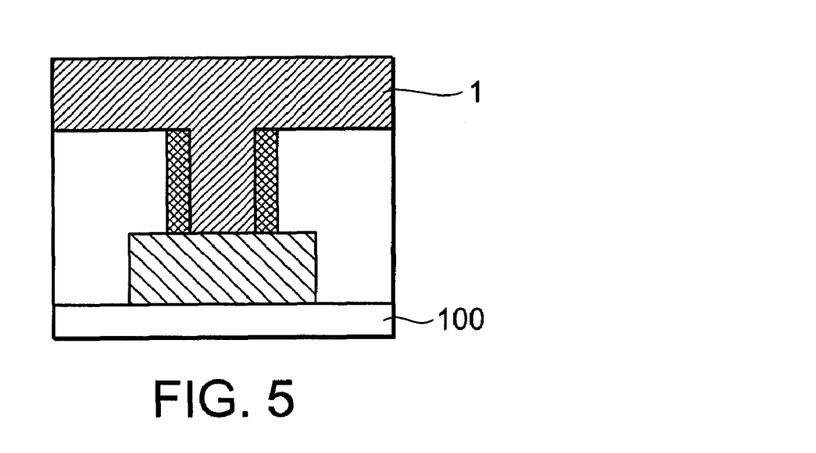
FIGS. 5 and 6 are sectional views for describing the production process in each of the first and the second embodiments.
Figure 6:
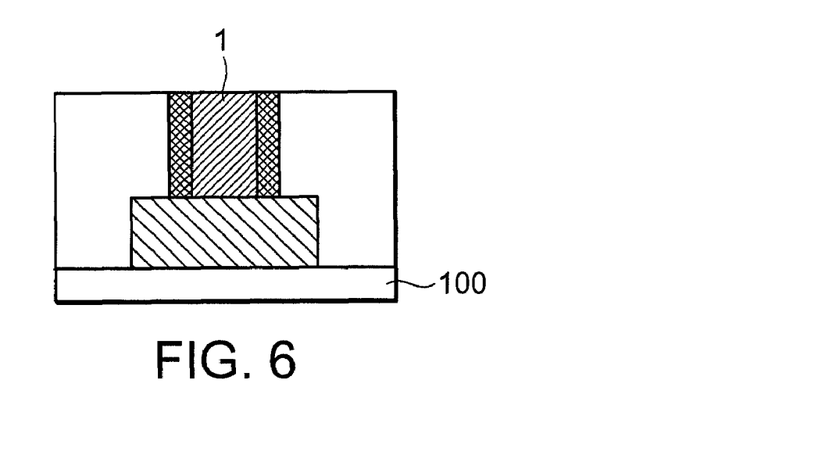
Figure 7:
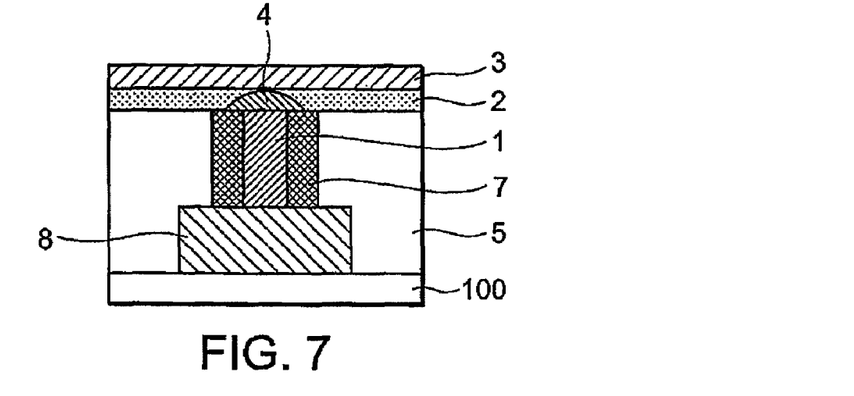
FIG. 7 is a sectional view of a first memory element according to the first embodiment.

Referring to FIGS. 2 to 7, description will be made of a semiconductor device and a method of producing the same according to a first embodiment of this invention. FIGS. 2 to 6 are sectional views for describing a sequence of steps in a production process of a first memory element of a phase change memory. FIG. 7 is a sectional view of the first memory element obtained in this embodiment.

Figure 2:
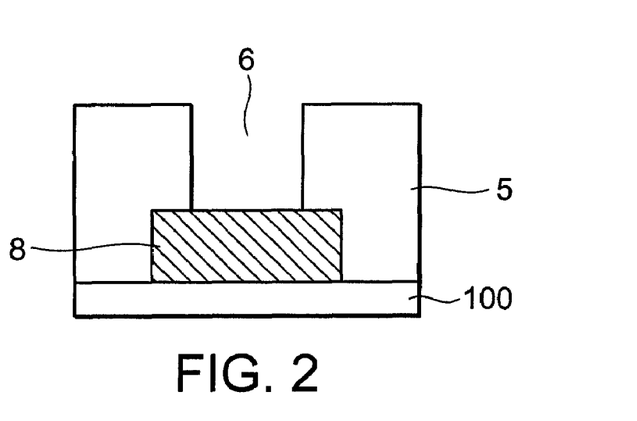
FIGS. 2 to 4 are sectional view for describing a production process of a memory element in each of first through fourth embodiments.
Figure 3:
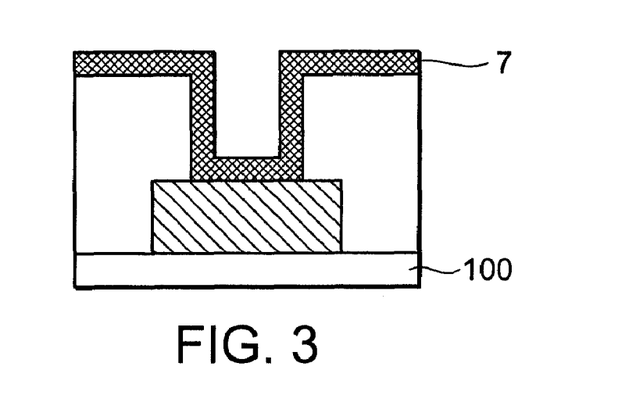

As illustrated in FIG. 2, a lower electrode 8 is formed on a semiconductor substrate 100. An interlayer insulation film 5 is formed on the semiconductor substrate 100 to cover the lower electrode 8. A contact hole 6 is formed in the interlayer insulation film 5 deposited on the lower electrode 8. For example, the interlayer insulation film 5 comprises a silicon oxide film ($SiO_2$ film) having a thickness of 1 μm. The contact hole 6 has an aperture diameter of 180 nm. Next, as illustrated in FIG. 3, a sidewall $Si_3N_4$ film (silicon nitride film) 7 for forming a sidewall is formed. The sidewall $Si_3N_4$ film 7 as an anti-oxidizing insulation film has a thickness (T) which is equal to 60 nm in this embodiment. Preferably, the sidewall $Si_3N_4$ film 7 as the anti-oxidizing insulation film has a thickness not smaller than 50 nm. Although the thickness is desirably as large as possible, the upper limit is preferably 100 nm for the purpose of miniaturization.

Figure 4:
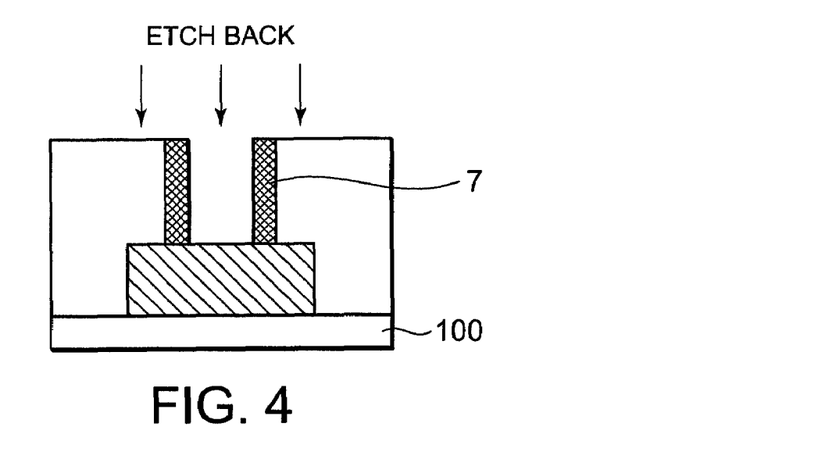

Next, as illustrated in FIG. 4, the sidewall $Si_3N_4$ film 7 is etched back to be left only on a sidewall of the contact hole 6. Next, as illustrated in FIG. 5, a material of a heater electrode 1, such as tungsten (W) or titanium nitride (TiN), is filled in the contact hole 6 to be connected to the lower electrode 8. Next, as illustrated in FIG. 6, CMP (Chemical Mechanical Polishing) is performed to planarize or flatten upper surfaces of the heater electrode 1, the interlayer insulation film 5, and the sidewall $Si_3N_4$ film 7 so that the upper surfaces are located at a same level. In the contact hole 6, the sidewall $Si_3N_4$ film 7 is formed in a ring shape and the heater electrode 1 is formed inside the sidewall $Si_3N_4$ film 7.

Next, as illustrated in FIG. 7, a phase change film 2 and an upper electrode 3 are formed. The lower electrode 8, the heater electrode 1, the phase change film 2, and the upper electrode 3 are electrically connected. The upper electrode 3 is formed by a conductive film such as tungsten (W) or aluminum (Al). As a material of the phase change film 2, use may be made of a material containing at least two elements selected from germanium (Ge), antimony (Sb), tellurium (Te), selenium (Se), gallium (Ga), and indium (In). For example, the material may be gallium antimonide (GaSb), indium antimonide (InSb), indium selenide (InSe), antimony telluride ($Sb_2Te_3$), germanium telluride (GaTe), $Ge_2Sb_2Te_5$, InSbTe, GaSeTe, $SnSb_2Te_4$, or InSbGe.

In the first memory element according to this embodiment, the sidewall $Si_3N_4$ film 7 and the heater electrode 1 are formed in the contact hole 6 in the interlayer insulation film 5. On the upper surfaces of the heater electrode 1, the sidewall $Si_3N_4$ film 7, and the interlayer insulation film 5 which are planarized by CMP at a same level, the phase change film 2 and the upper electrode 3 are formed. The heater electrode 1 is connected at its upper surface to the phase change film 2 and is surrounded by the sidewall $Si_3N_4$ film 7 at its side surface. A phase change region 4 is formed around a contact surface between the phase change film 2 and the heater electrode 1 and extended to the upper surface of the sidewall $Si_3N_4$ film 7. However, the phase change region 4 stays within the upper surface of the sidewall $Si_3N_4$ film 7 does not extend outward to the upper surface of the interlayer insulation film 5. Thus, the phase change film 2 has a phase change region 4 which is formed on the upper surfaces of the heater electrode 1 and the sidewall insulation film 7 and which is not formed on the upper surface of the interlayer insulation film 5.

As described above, the sidewall $Si_3N_4$ film 7 has a thickness not smaller than 50 nm (equal to 60 nm in this embodiment). With this structure, the heater electrode 1 and the phase change region 4 are not contacted with the interlayer insulation film 5. Therefore, it is possible to prevent oxidization of the heater electrode 1 and the phase change region 4 which have a high temperature during a rewriting operation. Thus, the phase change memory prevented from oxidization of the heater electrode and the phase change region and stably operable can be obtained.

Second Embodiment

Figure 8:
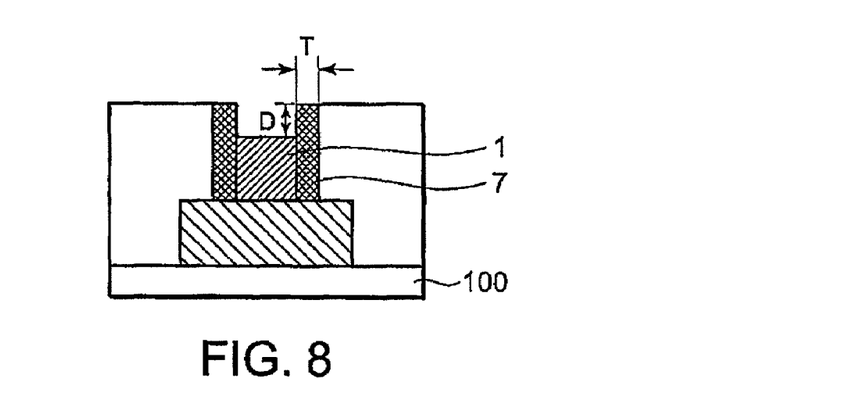
FIGS. 8 and 9 are sectional views for describing the production process in the second embodiment.
Figure 9:
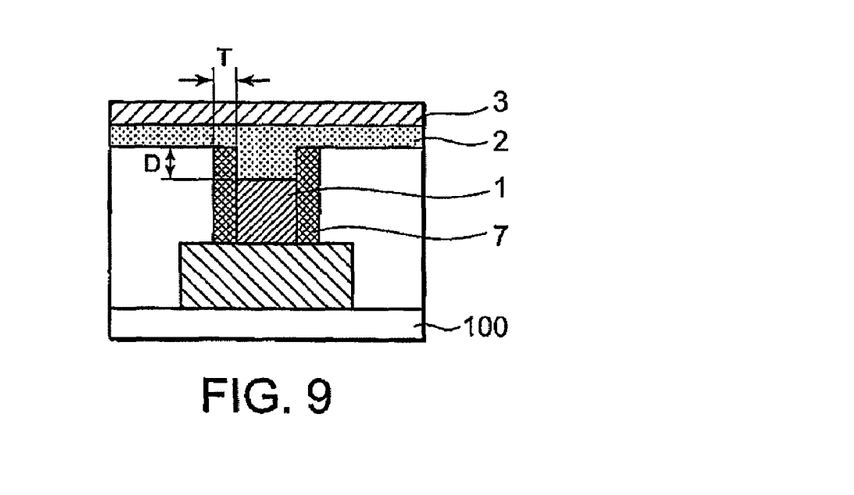
Figure 10:
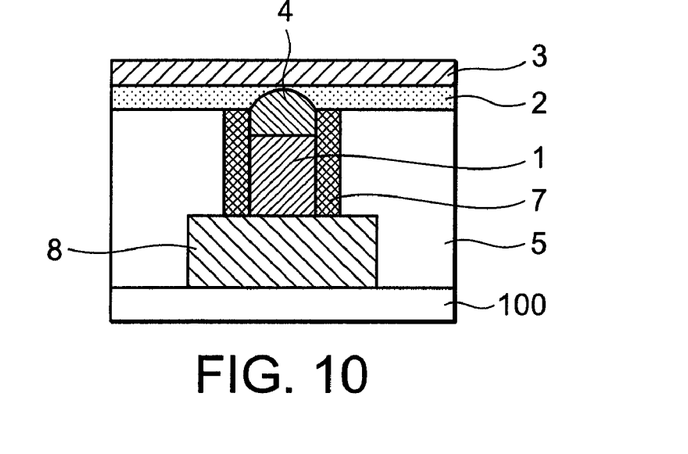
FIG. 10 is a sectional view of a second memory element according to the second embodiment.

Referring to FIGS. 2 to 6 and 8 to 10, description will be made of a semiconductor device a method of producing the same according to a second embodiment of this invention. FIGS. 2 to 6, 8, and 9 are sectional views for describing a sequence of steps in a production process of a phase change memory. FIG. 10 is a sectional view of a second memory element obtained in this embodiment.

As illustrated in FIG. 2, a lower electrode 8 is formed on a semiconductor substrate 100. An interlayer insulation film 5 is formed on the semiconductor substrate 100 to cover the lower electrode 8. A contact hole 6 is formed in the interlayer insulation film 5 deposited on the lower electrode 8. For example, the interlayer insulation film 5 comprises a silicon oxide film having a thickness of 1 μm. The contact hole 6 has an aperture diameter of 120 nm. Next, as illustrated in FIG. 3, a sidewall $Si_3N_4$ film 7 for forming a sidewall is formed. The sidewall $Si_3N_4$ film 7 as an anti-oxidizing insulation film has a thickness (T) which is equal to 30 nm in this embodiment. Preferably, the sidewall $Si_3N_4$ film 7 as the anti-oxidizing insulation film has a thickness not smaller than 5 nm. Although the thickness is desirably as large as possible, the upper limit is preferably 100 nm so that a pattern is not excessively large. More preferably, the sidewall $Si_3N_4$ film 7 has a thickness not smaller than 10 nm and not greater than 50 nm.

Next, as illustrated in FIG. 4, the sidewall $Si_3N_4$ film 7 is etched back to be left only on a sidewall of the contact hole 6. Next, as illustrated in FIG. 5, a material of a heater electrode 1, such as tungsten (W) or titanium nitride (TiN), is filled in the contact hole 6 to be connected to the lower electrode 8.

Next, as illustrated in FIG. 6, CMP is performed to planarize or flatten upper surfaces of the heater electrode 1, the interlayer insulation film 5, and the sidewall $Si_3N_4$ film 7 so that the upper surfaces are located at a same level. In the contact hole 6, the sidewall $Si_3N_4$ film 7 is formed in a ring shape and the heater electrode 1 is formed inside the sidewall $Si_3N_4$ film 7.

Thereafter, as illustrated in FIG. 8, the heater electrode 1 is etched from its planarized upper surface and dented or lowered in level from the planarized upper surface to form a recessed structure with a recess. Herein, the heater electrode 1 is etched by 40 nm, which is a depth from the planarized upper surface and will hereinafter be referred to as a recess depth D (nm). The recess depth D (nm) is determined to satisfy:

$$D+T \geq 50 \text{ nm}$$

where T (nm) represents the thickness of the sidewall $Si_3N_4$ film 7. If the thickness T (nm) of the sidewall $Si_3N_4$ film 7 is large, the depth D is reduced. The total sum of the depth D and the thickness T is equal to 50 nm or more. In this embodiment, T is equal to 30 nm, D is equal to 40 nm, and D+T is equal to 70 nm. In the first embodiment described above, the thickness T is equal to 60 nm, the depth D is equal to 0 nm, and D+T is equal to 60 nm.

The thickness T of the sidewall $Si_3N_4$ film 7 and the recess depth D (nm) are determined by a thickness required for anti-oxidization and a thickness required for extension of the phase change region 4. The thickness T of the sidewall $Si_3N_4$ film 7 is preferably 5 nm or more. Although the thickness T is desirably as large as possible, the upper limit is preferably 100 nm in view of a pattern. More preferably, the thickness T of the sidewall $Si_3N_4$ film 7 is not smaller than 10 nm and not greater than 70 nm. The total sum of the thickness T and the recess depth D is preferably 50 nm or more. The upper limit is not present theoretically but is preferably 200 nm in view of a pattern. More preferably, the total sum of the thickness T and the recess depth D is not smaller than 60 nm and not greater than 150 nm.

Next, as illustrated in FIG. 9, a phase change film 2 and an upper electrode 3 are formed. Each of the phase change film 2 and the upper electrode 3 is made of a material same as that in the first embodiment. The phase change film 2 is filled in the recess of the heater electrode 1 dented as mentioned above. The lower electrode 8, the heater electrode 1, the phase change film 2, and the upper electrode 3 are electrically connected.

FIG. 10 shows a phase change region 4 of the second memory element. The level of the upper surface of the heater electrode 1 is dented from the level of the planarized upper surface of the sidewall $Si_3N_4$ film 7 so that most part of the phase change region 4 is formed in a recessed area surrounded by the sidewall $Si_3N_4$ film 7. On the upper surface of the sidewall $Si_3N_4$ film 7, the phase change region 4 is slightly formed. However, the phase change region 4 is not formed on the upper surface of the interlayer insulation film 5. Thus, the heater electrode 1 has a recessed structure so that a contact surface between the heater electrode 1 and the phase change film 2 is located inside the recess. As a consequence, the phase change region 4 is small and a rewriting current is reduced.

In the second memory element according to this embodiment, the sidewall $Si_3N_4$ film 7 and the heater electrode 1 are formed in the contact hole in the interlayer insulation film 5. From the planarized upper surfaces of the interlayer insulation film 5, the sidewall $Si_3N_4$ film 7, and the heater electrode 1, the heater electrode 1 is etched so that the upper surface of the heater electrode 1 is dented by D (nm). Thereafter, the phase change film 2 and the upper electrode 3 are formed. Since the contact surface between the heater electrode 1 and the phase change film 2 is located inside the recess, most part of the phase change region 4 is formed inside the recessed area surrounded by the sidewall $Si_3N_4$ film 7. The heater electrode 1 is surrounded by the sidewall $Si_3N_4$ film 7 of a ring shape. The phase change region 4 is not formed on the upper surface of the interlayer insulation film 5. The heater electrode 1 and the phase change region 4 are not contacted with the interlayer insulation film 5 as an oxidizing insulation film so that oxidization is prevented. With the above-mentioned structure in which the heater electrode 1 and the phase change region 4 are not contacted with the interlayer insulation film 5 as the oxidizing insulation film, the phase change memory prevented from oxidization of the heater electrode and the phase change region and stably operable can be obtained.

Third Embodiment

Figure 11:
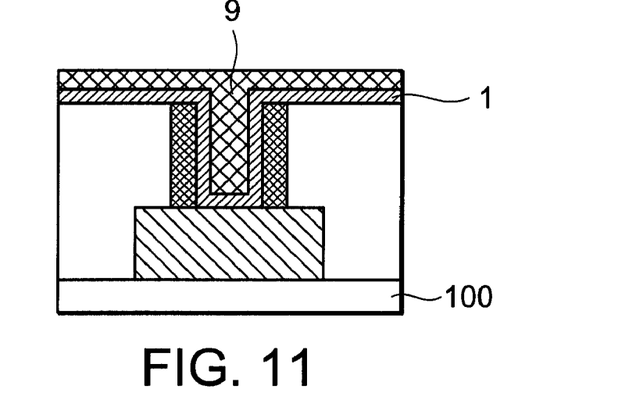
FIGS. 11 and 12 are sectional views for describing the production process in the third embodiment.
Figure 12:
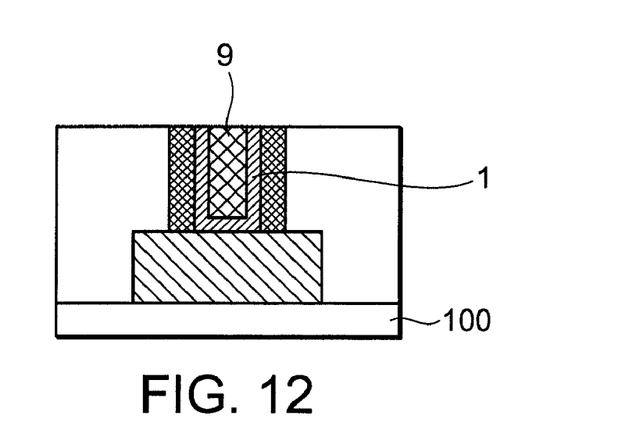
Figure 13:
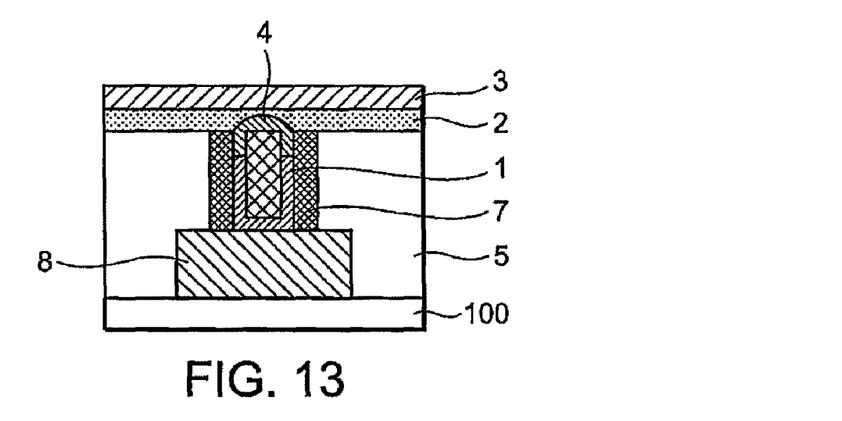
FIG. 13 is a sectional view of a third memory element according to the third embodiment.
Figure 14:
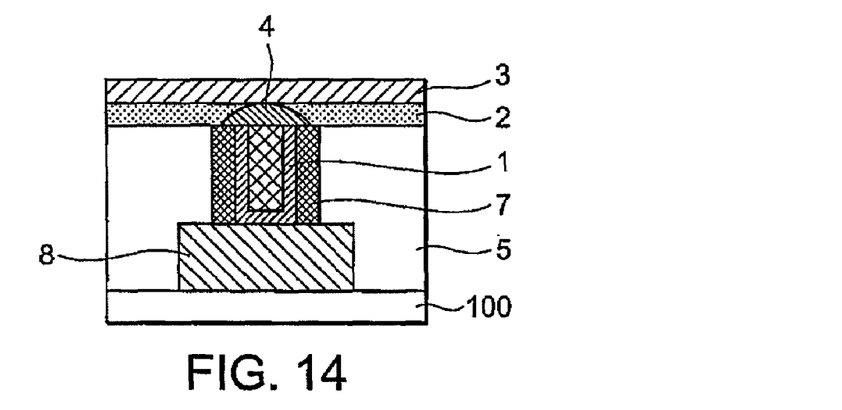
FIG. 14 is a sectional view of a fourth memory element according to the third embodiment.

Referring to FIGS. 2 to 4 and 11 to 14, description will be made of a semiconductor device and a method of producing the same according to a third embodiment of this invention. FIGS. 2 to 4, 11, and 12 are sectional views for describing a sequence of steps in a production process of a phase change memory. FIGS. 13 and 14 are sectional views of third and fourth memory elements obtained in this embodiment, respectively.

In each of the third and the fourth memory elements according to the third embodiment, a sidewall film and a heater electrode of a cylindrical shape are formed in a contact hole in an interlayer insulation film. Inside the heater electrode, a buried insulation film is formed. The heater electrode has a cylindrical shape with a bottom connected to a lower electrode.

Referring to FIGS. 2 through 4, the production process of this embodiment is similar to that of the first embodiment. As illustrated in FIG. 2, a contact hole 6 is formed in an interlayer insulation film 5 deposited on a lower electrode 8. Next, as illustrated in FIG. 3, a sidewall $Si_3N_4$ film 7 as an anti-oxidizing insulation film is formed to a thickness (T) of 30 nm in the third memory element and to a thickness (T) of 60 nm in the fourth memory element. Next, as illustrated in FIG. 4, the sidewall $Si_3N_4$ film 7 is etched back to be left only on a sidewall of the contact hole 6.

Next, as illustrated in FIG. 11, a heater electrode 1 and a buried insulation film 9 are deposited. For example, a material of the heater electrode 1, such as tungsten (W) or titanium nitride (TiN), is thinly deposited so that the contact hole 6 is hollow without being completely filled. Further, as the buried insulation film 9, a $Si_3N_4$ film is filled in the contact hole 6. Next, as illustrated in FIG. 12, CMP is performed to planarize or flatten upper surfaces of the interlayer insulation film 5, the sidewall $Si_3N_4$ film 7, the heater electrode 1, and the buried insulation film 9 so that the upper surfaces are located at a same level.

In the third memory element illustrated in FIG. 13, the heater electrode 1 is etched to a depth (D) of 40 nm and dented from the level of the planarized upper surface to form a recessed structure with a recess. The recess depth D (nm) is determined to satisfy:

$D+T \geqq 50$ nm where T (nm) represents the thickness of the sidewall $Si_3N_4$ film 7. If the thickness T (nm) of the sidewall $Si_3N_4$ film 7 is large, the depth D is reduced. The total sum of the depth D and the thickness T is equal to 50 nm or more. In the third memory element, T is equal to 30 nm, D is equal to 40 nm, and D+T is equal to 70 nm. Next, a phase change film 2 and an upper electrode 3 are formed. Each of the phase change film 2 and the upper electrode 3 is made of a material same as that in the first embodiment.

Most part of a phase change region 4 in the third memory element is formed in a recessed area surrounded by the sidewall $Si_3N_4$ film 7. On the upper surface of the sidewall $Si_3N_4$ film 7, the phase change region 4 is slightly formed. However, the phase change region 4 is not formed on the upper surface of the interlayer insulation film 5. Thus, the heater electrode 1 has a recessed structure so that a contact surface between the heater electrode 1 and the phase change film 2 is located inside the recess. As a consequence, the phase change region 4 is small and a rewriting current is reduced.

By selecting the thickness T and the recess depth D so that the total sum of the thickness T and the recess depth D is not smaller than a predetermined value, the phase change region 4 can be formed only in the recessed area surrounded by the sidewall $Si_3N_4$ film 7 and a partial area on the upper surface of the sidewall $Si_3N_4$ film 7. The thickness T of the sidewall $Si_3N_4$ film 7 and the recess depth D (nm) are determined by a thickness required for anti-oxidization and a thickness required for extension of the phase change region 4. Preferably, the thickness T of the sidewall $Si_3N_4$ film 7 is not smaller than 5 nm and not greater than 100 nm. More preferably, the thickness T of the sidewall $Si_3N_4$ film 7 is not smaller than 10 nm and not greater than 50 nm. Preferably, the total sum of the thickness T and the recess depth D is not smaller than 50 nm and not greater than 200 nm. More preferably, the total sum is not smaller than 60 nm and not greater than 150 nm. By selecting those values as mentioned above, the heater electrode 1 is surrounded by the sidewall $Si_3N_4$ film 7 of a ring shape and the phase change region 4 is not formed on the upper surface of the interlayer insulation film 5. Since the heater electrode 1 and the phase change region 4 are not contacted with the interlayer insulation film 5 as an oxidizing insulation film, oxidization can be prevented.

FIG. 14 shows the fourth memory element. In the fourth memory element, the thickness (T) of the sidewall $Si_3N_4$ film 7 is as thick as 60 nm. Thus, the upper surface of the heater electrode 1 does not have a recessed structure but is located at a level same as the upper surfaces of the interlayer insulation film 5 and the sidewall $Si_3N_4$ film 7. As compared with the third memory element (FIG. 13), the fourth memory element has a recess depth D equal to 0 nm. By increasing the thickness (T) of the sidewall $Si_3N_4$ film 7, the heater electrode 1 and the phase change region 4 are not contacted with the interlayer insulation film 5 as the oxidizing insulation film so that oxidization is prevented.

In the phase change memory of this embodiment, the sidewall $Si_3N_4$ film 7, the heater electrode 1 of a cylindrical shape, and the buried $Si_3N_4$ film 9 are formed in the contact hole 6 in the interlayer insulation film 5. From the planarized upper surfaces of the interlayer insulation film 5, the sidewall $Si_3N_4$ film 7, the heater electrode 1, and the buried $Si_3N_4$ film 9, the heater electrode 1 is etched so that the upper surface of the heater electrode 1 is dented by D (nm). Thereafter, the phase change film 2 and the upper electrode 3 are formed. With the above-mentioned structure in which the heater electrode 1 and the phase change region 4 are not contacted with the interlayer insulation film 5 as the oxidizing insulation film, it is possible to obtain the phase change memory prevented from oxidization of the heater electrode and the phase change region and stably operable.

Fourth Embodiment

Figure 15:
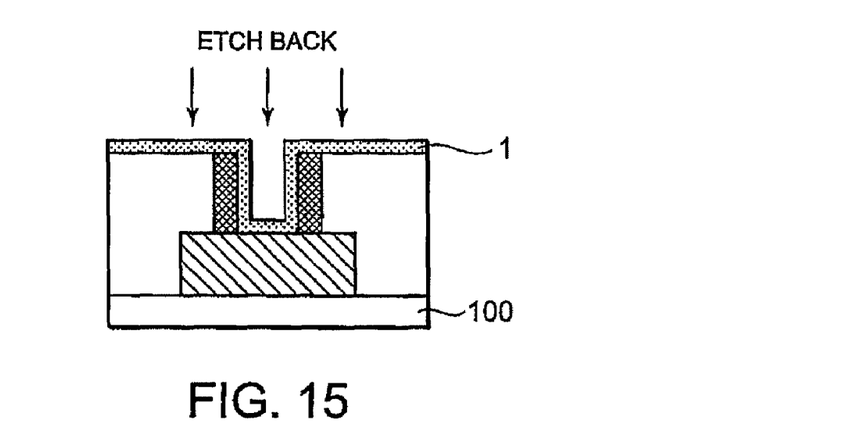
FIGS. 15 and 16 are sectional views for describing the production process in the fourth embodiment.
Figure 16:
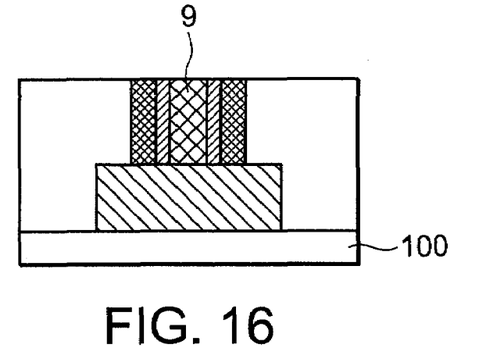
Figure 17:
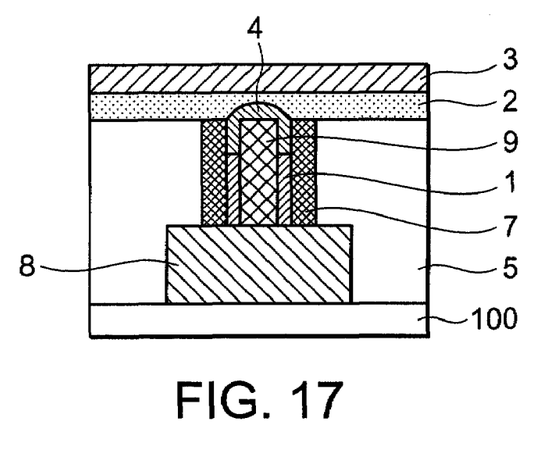
FIG. 17 is a sectional view of a fifth memory element according to the fourth embodiment.
Figure 18:
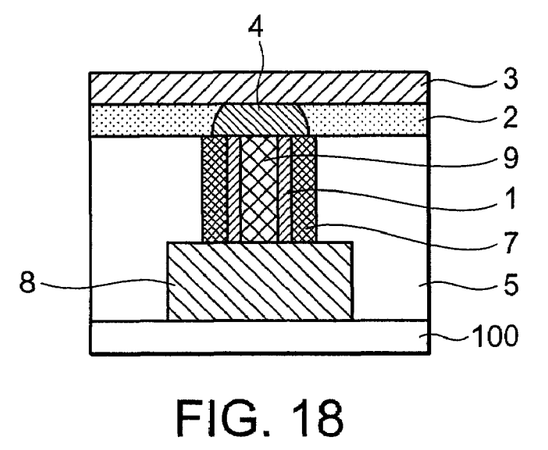
FIG. 18 is a sectional view of a sixth memory element according to the fourth embodiment.

Referring to FIGS. 2 to 4 and 15 to 18, description will be made of a semiconductor device and a method of producing the same according to a fourth embodiment of this invention. FIGS. 2 to 4, 15, and 16 are sectional views for describing a sequence of steps in a production process of a phase change memory. FIGS. 17 and 18 are sectional views of fifth and sixth memory elements obtained in this embodiment, respectively.

In each of the fifth and the sixth memory elements according to the fourth embodiment, a sidewall $Si_3N_4$ film, a heater electrode, and a buried insulation film are formed in a contact hole in a ring shape.

Referring to FIGS. 2 through 4, the production process of this embodiment is similar to that of the first embodiment. As illustrated in FIG. 2, a contact hole 6 is formed in an interlayer insulation film 5 deposited on a lower electrode 8. Next, as illustrated in FIG. 3, a sidewall $Si_3N_4$ film 7 as an anti-oxidizing insulation film is formed to a thickness (T) of 30 nm in the fifth memory element and to a thickness (T) of 60 nm in the sixth memory element. Next, as illustrated in FIG. 4, the sidewall $Si_3N_4$ film 7 is etched back to be left only on a sidewall of the contact hole 6.

Next, as illustrated in FIG. 15, a heater electrode 1 is deposited. For example, a material of the heater electrode 1, such as tungsten (W) or titanium nitride (TiN), is thinly deposited so that the contact hole 6 is hollow without being completely filled. Then, the material of the heater electrode 1 is etched back to form the heater electrode 1 of a ring shape inside the sidewall $Si_3N_4$ film 7. Further, as the buried insulation film 9, a $Si_3N_4$ film is filled in the contact hole 6. Next, as illustrated in FIG. 16, CMP is performed to planarize or flatten upper surfaces of the interlayer insulation film 5, the sidewall $Si_3N_4$ film 7, the heater electrode 1, and the buried insulation film 9 so that the upper surfaces are located at a same level.

In the fifth memory element illustrated in FIG. 17, the heater electrode 1 is etched to a depth (D) of 40 nm and dented from the level of the planarized upper surface to form a recessed structure with a recess. The recess depth D (nm) is determined to satisfy:

$$D+T \geq 50 \text{ nm}$$

where T (nm) represents the thickness of the sidewall $Si_3N_4$ film 7. If the thickness T (nm) of the sidewall $Si_3N_4$ film 7 is large, the depth D is reduced. The total sum of the depth D and the thickness T is equal to 50 nm or more. In the fifth memory element, T is equal to 30 nm, D is equal to 40 nm, and D+T is equal to 70 nm. Next, a phase change film 2 and an upper electrode 3 are formed. Each of the phase change film 2 and the upper electrode 3 is made of a material same as that in the first embodiment.

In the fifth memory element, the upper surface of the heater electrode 1 is dented or lowered in level from the upper surface of the planarized sidewall $Si_3N_4$ film 7 so that most part of a phase change region 4 is formed in a recessed area surrounded by the sidewall $Si_3N_4$ film 7. On the upper surface of the sidewall $Si_3N_4$ film 7, the phase change region 4 is slightly formed. However, the phase change region 4 is not formed on the upper surface of the interlayer insulation film 5. Thus, the heater electrode 1 has a recessed structure so that a contact surface between the heater electrode 1 and the phase change film 2 is located inside the recess. As a consequence, the phase change region 4 is small and a rewriting current is reduced.

By selecting the thickness T and the recess depth D so that the total sum of the thickness T and the recess depth D is not smaller than a predetermined value, the phase change region 4 can be formed only in the recessed area surrounded by the sidewall $Si_3N_4$ film 7 and a partial area on the upper surface of the sidewall $Si_3N_4$ film 7. The thickness T of the sidewall $Si_3N_4$ film 7 and the recess depth D (nm) are determined by a thickness required for anti-oxidization and a thickness required for extension of the phase change region 4. Preferably, the thickness T of the sidewall $Si_3N_4$ film 7 is not smaller than 5 nm and not greater than 100 nm. More preferably, the thickness T of the sidewall $Si_3N_4$ film 7 is not smaller than 10 nm and not greater than 50 nm. Preferably, the total sum of the thickness T and the recess depth D is not smaller than 50 nm and not greater than 200 nm. More preferably, the total sum is not smaller than 60 nm and not greater than 150 nm. By selecting those values as mentioned above, the heater electrode 1 is surrounded by the sidewall $Si_3N_4$ film 7 of a ring shape and the phase change region 4 is not formed on the upper surface of the interlayer insulation film 5. Since the heater electrode 1 and the phase change region 4 are not contacted with the interlayer insulation film 5 as the oxidizing insulation film, oxidization can be prevented.

FIG. 18 shows the sixth memory element. In the sixth memory element, the thickness (T) of the sidewall $Si_3N_4$ film is as thick as 60 nm. Thus, the upper surface of the heater electrode 1 does not have a recessed structure but is located at a level same as the upper surfaces of the interlayer insulation film 5 and the sidewall $Si_3N_4$ film 7. As compared with the fifth memory element (FIG. 17), the sixth memory element has a recess depth D equal to 0 nm. By increasing the thickness (T) of the sidewall $Si_3N_4$ film 7, the heater electrode 1 and the phase change region 4 are not contacted with the interlayer insulation film 5 as the oxidizing insulation film so that oxidization is prevented.

In the phase change memory of this embodiment, the sidewall $Si_3N_4$ film 7, the heater electrode 1, and the buried $Si_3N_4$ film 9 are formed in a ring shape in the contact hole 6 in the interlayer insulation film 5. From the planarized upper surfaces of the interlayer insulation film 5, the sidewall $Si_3N_4$ film 7, the heater electrode 1, and the buried $Si_3N_4$ film 9, the heater electrode 1 is etched so that the upper surface of the heater electrode 1 is dented by D (nm). Thereafter, the phase change film 2 and the upper electrode 3 are formed. With the above-mentioned structure in which the heater electrode 1 and the phase change region 4 are not contacted with the interlayer insulation film 5 as the oxidizing insulation film, it is possible to obtain the phase change memory prevented from oxidization of the heater electrode and the phase change region and stably operable.

Fifth Embodiment

Figure 23:
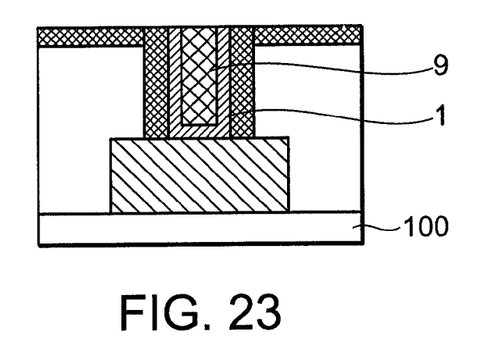
Figure 24:
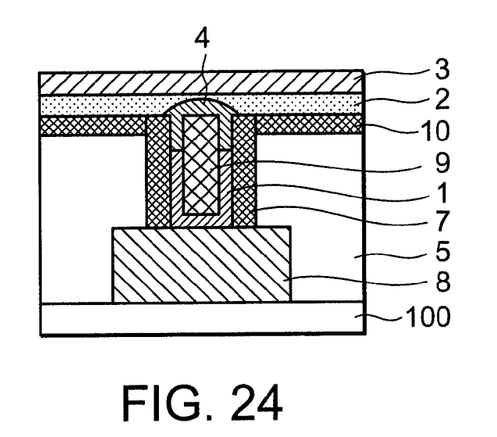
FIG. 24 is a sectional view of a seventh memory element according to the fifth embodiment.
Figure 25:
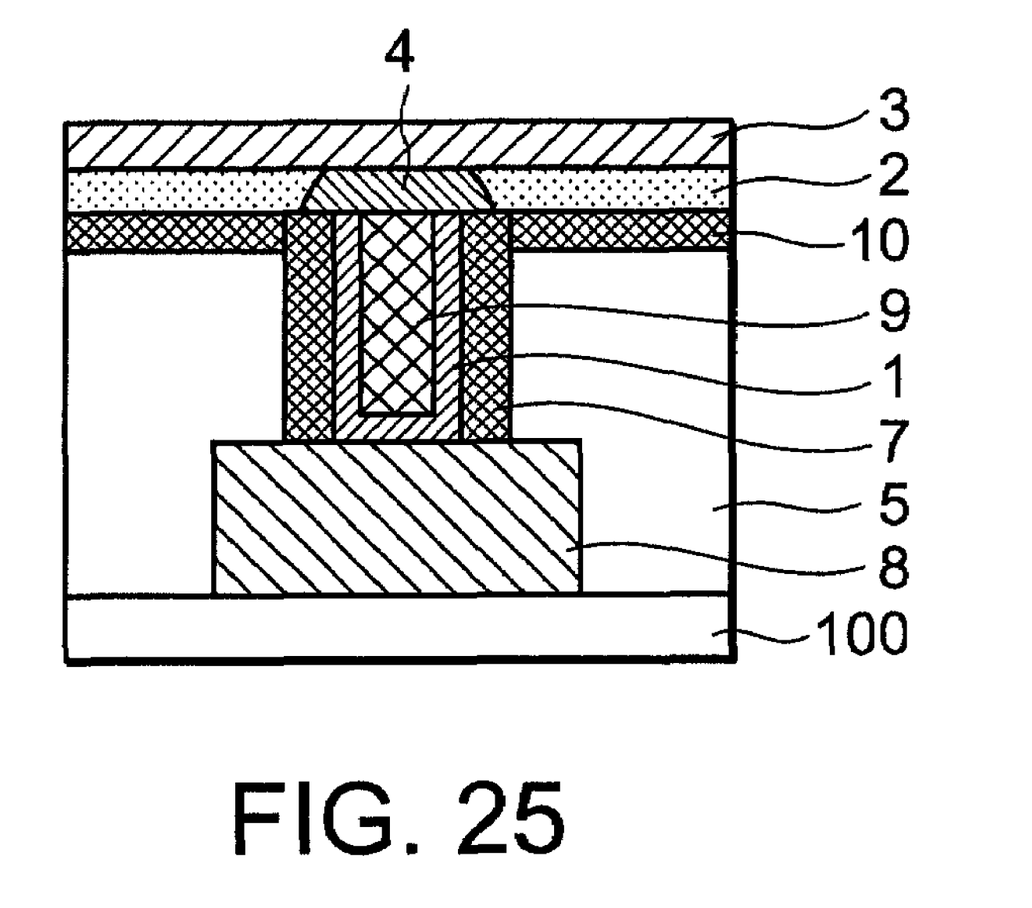
FIG. 25 is a sectional view of an eighth memory element according to the fifth embodiment.

Referring to FIGS. 19 to 25, description will be made of a semiconductor device and a method of producing the same according to a fifth embodiment. FIGS. 19 to 23 are sectional views for describing a sequence of steps in a production process of a phase change memory. FIGS. 24 and 25 are sectional views of seventh and eighth memory elements obtained in this embodiment, respectively.

In each of the seventh and the eighth memory elements according to the fifth embodiment, an interlayer insulation film comprises a plurality of layers including an anti-oxidizing insulation film as an upper layer.

Figure 19:
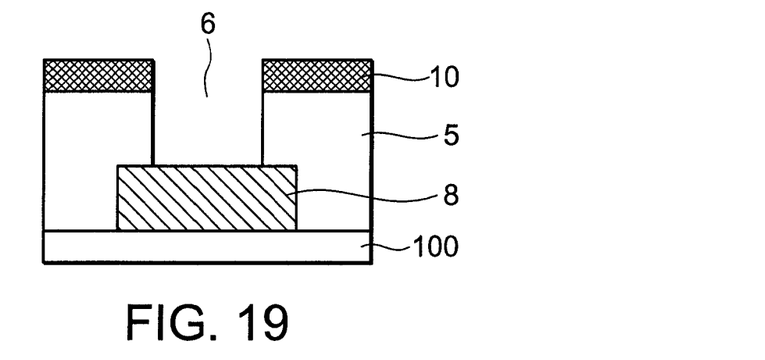
FIGS. 19 to 23 are sectional views for describing a production process of a memory element in a fifth embodiment.
Figure 20:
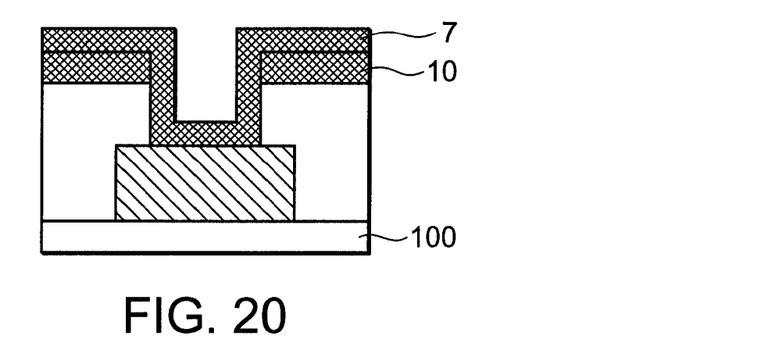
Figure 21:
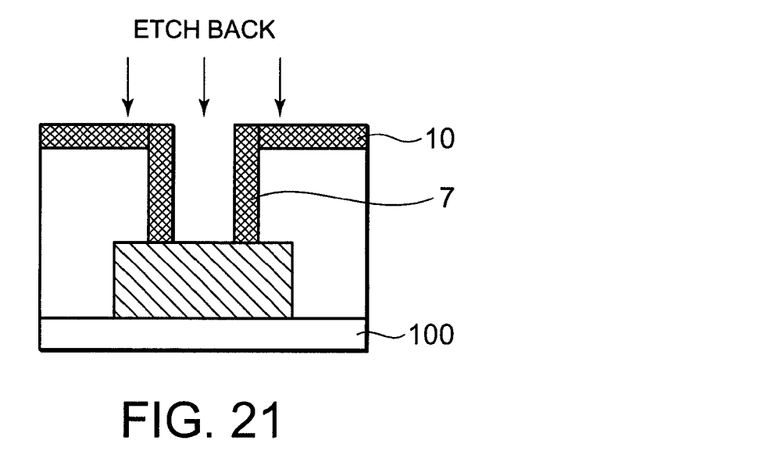
Figure 22:
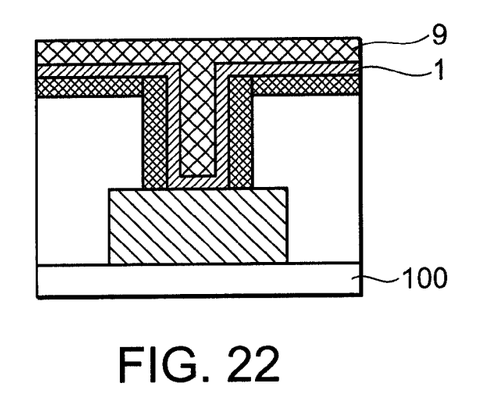

The production process of this embodiment is as follows. An interlayer insulation film 5 is deposited on a lower electrode 8. On an upper surface of the interlayer insulation film 5, an interlayer $Si_3N_4$ film 10 is deposited. For example, the interlayer insulation film 5 comprises a silicon oxide film having a thickness of 1 μm. The interlayer $Si_3N_4$ film 10 comprises a $Si_3N_4$ film having a thickness of 20 nm. As illustrated in FIG. 19, a contact hole 6 is formed in the interlayer $Si_3N_4$ film 10 and the interlayer insulation film 5 on the lower electrode 8. Next, as illustrated in FIG. 20, a sidewall $Si_3N_4$ film 7 is formed. The sidewall $Si_3N_4$ film 7 has a thickness (T) equal to 30 nm. Next, as illustrated in FIG. 21, the sidewall $Si_3N_4$ film 7 is etched back. Specifically, the sidewall $Si_3N_4$ film 7 on the upper surface of the interlayer $Si_3N_4$ film 10 and at the bottom of the contact hole 20 are etched. Consequently, the sidewall $Si_3N_4$ film 7 is left on a side surface of the interlayer $Si_3N_4$ film 10 on the upper surface of the interlayer insulation film 5 and on a sidewall of the contact hole 6.

Next, as illustrated in FIG. 21, a heater electrode 1 and a buried insulation film 9 are deposited. For example, a material of the heater electrode 1, such as tungsten (W) or titanium nitride (TiN), is thinly deposited so that the contact hole 6 is hollow without being completely filled. Further, as the buried insulation film 9, a $Si_3N_4$ film is filled in the contact hole 6. Next, as illustrated in FIG. 23, CMP is performed to planarize or flatten upper surfaces of the interlayer $Si_3N_4$ film 10, the sidewall $Si_3N_4$ film 7, the heater electrode 1, and the buried insulation film 9 so that the upper surfaces are located at a same level.

In the seventh memory element illustrated in FIG. 24, the heater electrode 1 is etched from the upper surface planarized by CMP in FIG. 23 to a depth (D) of 40 nm and dented from the level of the planarized upper surface to form a recessed structure with a recess. The recess depth D (nm) is determined to satisfy:

$$D+T \geq 50 \text{ nm}$$

where T (nm) represents the thickness of the sidewall $Si_3N_4$ film 7. If the thickness T (nm) of the sidewall $Si_3N_4$ film 7 is small, the depth D is increased. The total sum of the depth D and the thickness T is equal to 50 nm or more. In the fifth memory element, T is equal to 30 nm, D is equal to 40 nm, and D+T is equal to 70 nm. Next, a phase change film 2 and an upper electrode 3 are formed. Each of the phase change film 2 and the upper electrode 3 is made of a material same as that in the first embodiment.

In the seventh memory element, the upper surface of the heater electrode 1 is dented or lowered in level from the upper surface of the planarized sidewall $Si_3N_4$ film 7 so that most part of a phase change region 4 is formed in a recessed area surrounded by the sidewall $Si_3N_4$ film 7. On the upper surface of the sidewall $Si_3N_4$ film 7, the phase change region 4 is slightly formed. Thus, the heater electrode 1 has a recessed structure so that a contact surface between the heater electrode 1 and the phase change film 2 is located inside the recess. As a consequence, the phase change region 4 is small and a rewriting current is reduced. In the seventh memory element, the sidewall $Si_3N_4$ film 7 and the interlayer $Si_3N_4$ film 10 are interposed between each of the heater electrode 1 and the phase change region 4 and the interlayer insulation film 5. Therefore, the heater electrode 1 and the phase change region 4 are prevented from being oxidized. By preventing oxidization, it is possible to obtain the phase change memory stably operable.

FIG. 25 shows an eighth memory element. In the eighth memory element, the upper surface of the heater electrode 1 does not have a recessed structure but is located at a level same as the upper surfaces of the interlayer insulation film 5 and the sidewall $Si_3N_4$ film 7. As compared with the seventh memory element (FIG. 24), the eighth memory element has a recess depth D equal to 0 nm. In the eighth memory element also, the sidewall $Si_3N_4$ film 7 and the interlayer $Si_3N_4$ film 10 are interposed between each of the heater electrode 1 and the phase change region 4 and the interlayer insulation film 5. Therefore, the heater electrode 1 and the phase change region 4 are prevented from being oxidized. By preventing oxidization, it is possible to obtain the phase change memory stably operable.

In the seventh and the eighth memory elements, the sidewall $Si_3N_4$ film 7 and the interlayer $Si_3N_4$ film 10 are desired to have a thickness not smaller than a lower limit assuring an anti-oxidization property and not greater than an upper limit free from occurrence of cracks or distortion. Therefore, the interlayer $Si_3N_4$ film 10 preferably has a thickness not smaller than 5 nm and not greater than 50 nm, more preferably, not smaller than 5 nm and not greater than 30 nm. Similarly, the sidewall $Si_3N_4$ film 7 preferably has a thickness (T) not smaller than 10 nm and not greater than 100 nm, more preferably, not smaller than 10 nm and not greater than 70 nm. By the above-mentioned thicknesses, the heater electrode 1 and the phase change region 4 are prevented from being oxidized. By preventing oxidization, the phase change memory stably operable can be obtained.

Although this invention has been described in conjunction with a few preferred embodiments thereof, this invention is not limited to the foregoing embodiments but may be modified in various other manners within the scope of the appended claims. For example, the $Si_3N_4$ film is used as the anti-oxidizing insulation film. However, not being limited to the $Si_3N_4$ film, any other appropriate film may be used as far as it has a high melting point and an anti-oxidization property.

What is claimed is:

1. A semiconductor device comprising a lower electrode formed on a semiconductor substrate, an interlayer insulation film formed over the semiconductor substrate and the lower electrode, the interlayer insulation film including a contact hole to expose a part of the lower electrode, a sidewall insulation film formed on a sidewall of the contact hole formed in the interlayer insulation film, a heater electrode formed in the contact hole and located inside the sidewall insulation film such that an upper surface of the heater electrode is lower in level than a top end of the sidewall insulation film, a phase change film formed in contact with the interlayer insulation film, the sidewall insulation film and the part of the heater electrode, and an upper electrode formed on the phase change film, the sidewall insulation film comprising an anti-oxidization insulation film, and the phase change film being in direct contact with the sidewall insulation film without an intervention of an oxide layer.

2. The semiconductor device as claimed in claim 1, wherein the phase change film has a phase change region which is formed on the upper surfaces of the heater electrode and the sidewall insulation film and which is not formed on an upper surface of the interlayer insulation film.

3. The semiconductor device as claimed in claim 1, wherein the phase change film has a phase change region which is formed on the upper surfaces of the heater electrode and the sidewall insulation film and which is not formed on the upper surface of the interlayer insulation film.

4. A semiconductor device comprising:
a lower electrode formed on a semiconductor substrate;
an interlayer insulation film formed on the semiconductor substrate to cover the lower electrode;
a sidewall insulation film formed on a sidewall of a contact hole formed in the interlayer insulation film to expose the lower electrode;
a heater electrode formed in the contact hole and located inside the sidewall insulation film;
a phase change film formed in contact with upper surfaces of the interlayer insulation film, the sidewall insulation film, and the heater electrode; and
an upper electrode formed on an upper surface of the phase change film;
wherein the sidewall insulation film comprising an anti-oxidization insulation film,
the upper surfaces of the sidewall insulation film and the interlayer insulation film are planarized to be located at a same level, the upper surface of the heater electrode being lower in level than those of the interlayer insulation film and the sidewall insulation film, and
wherein the sidewall insulation film has a thickness not smaller than 5 nm and not greater than 100 nm, the semiconductor device being designed to satisfy:

$$50 \text{ nm} \leq D+T \leq 200 \text{ nm},$$

where D represents a difference in level between the upper surface of the heater electrode and the upper surfaces of the interlayer insulation film and the sidewall insulation film and T represents the thickness of the sidewall insulation film.

5. The semiconductor device as claimed in claim 4, wherein the phase change film contains at least two elements selected from germanium (Ge), antimony (Sb), tellurium (Te), selenium (Se), gallium (Ga), and indium (In).

6. The semiconductor device as claimed in claim 4, wherein the sidewall insulation film comprises a nitride film.

7. The semiconductor device as claimed in claim 4, further comprising a buried insulation film formed in the contact hole and located inside the heater electrode.

8. The semiconductor device as claimed in claim 1, wherein the interlayer insulation film is a multilayer insulation film comprising an oxidizing insulation film and an anti-oxidizing insulation film.

9. A method of producing a semiconductor device, comprising:
depositing an interlayer insulation film to cover a lower electrode formed on a semiconductor substrate;
forming a contact hole in the interlayer insulation film to expose the lower electrode;
forming an anti-oxidizing sidewall insulation film on a sidewall of the contact hole;
forming a heater electrode in the contact hole and inside the sidewall insulation film;
planarizing upper surfaces of the sidewall insulation film, the heater electrode, and the interlayer insulation film so that the upper surfaces of the sidewall insulation film and the heater electrode formed inside the contact hole are located at a same level as that of the interlayer insulation film;
etching the heater electrode so that the upper surface of the heater electrode is lower in level than those of the interlayer insulation film and the sidewall insulation film;
forming a phase change film in contact with the upper surfaces of the interlayer insulation film, the side wall insulation film, and the heater electrode; and
forming an upper electrode on an upper surface of the phase change film,
wherein the sidewall insulation film has a thickness not smaller than 5 nm and not greater than 100 nm, the semiconductor device being designed to satisfy:

$$50 \text{ nm} \leq D+T \leq 200 \text{ nm},$$

where D represents a difference in level between the upper surface of the heater electrode and the upper surfaces of the interlayer insulation film and the sidewall insulation film and T represents the thickness of the sidewall insulation film.

10. A method of producing a semiconductor device, comprising:
depositing an interlayer insulation film to cover a lower electrode formed on a semiconductor substrate;
forming a contact hole in the interlayer insulation film to expose the lower electrode;
forming an anti-oxidizing sidewall insulation film on a sidewall of the contact hole;
forming a heater electrode in the contact hole and inside the sidewall insulation film;
planarizing upper surfaces of the sidewall insulation film, the heater electrode, and the interlayer insulation film so that the upper surfaces of the sidewall insulation film and the heater electrode formed inside the contact hole are located at a same level as that of the interlayer insulation film;
etching the heater electrode so that the upper surface of the heater electrode is lower in level than those of the interlayer insulation film and the sidewall insulation film;
forming a phase change film in contact with the upper surfaces of the interlayer insulation film, the side wall insulation film, and the heater electrode; and
forming an upper electrode on an upper surface of the phase change film,
wherein the step of forming the heater electrode is followed by the step of forming an anti-oxidizing buried insulation film in the contact hole and inside the heater electrode.

11. The method according to claim 9, wherein the phase change film contains at least two elements selected from germanium (Ge), antimony (Sb), tellurium (Te), selenium (Se), gallium (Ga), and indium (In).

12. The method according to claim 9, wherein the sidewall insulation film comprises a nitride film.

13. The method according to claim 9, wherein the interlayer insulation film is formed as a multilayer insulation film comprising an oxidizing insulation film and an anti-oxidizing insulation film.

14. A semiconductor device comprising:
a lower electrode formed on a semiconductor substrate;
an interlayer insulation film formed over the semiconductor substrate and the lower electrode, the interlayer insulation film having a contact hole to expose a part of the lower electrode;
a sidewall insulation film formed on a sidewall of the contact hole formed in the interlayer insulation film;
a heater electrode formed in the contact hole and located inside the sidewall insulation film;
a phase change film formed on upper surfaces of the interlayer insulation film, the sidewall insulation film, and the heater electrode; and
an upper electrode formed on an upper surface of the phase change film;
wherein the sidewall insulation film comprising an anti-oxidization insulation film, and the sidewall insulation film has a thickness not smaller than 5 nm and not greater than 100 nm to satisfy:

$50\ nm \leq B+T \leq 200\ nm$, where D represents a difference in level between the upper surface of the heater electrode and the upper surfaces of the interlayer insulation film and the sidewall insulation film and T represents the thickness of the sidewall insulation film.

* * * * *